United States Patent
Shindo

(10) Patent No.: US 7,474,034 B2
(45) Date of Patent: Jan. 6, 2009

(54) SURFACE ACOUSTIC WAVE ELEMENT AND SURFACE ACOUSTIC WAVE DEVICE USING THE SAME

(75) Inventor: Takehiko Shindo, Kawasaki (JP)

(73) Assignee: Epson Toyocom Corporation, Tokyo (JP)

( * ) Notice: Subject to any disclaimer, the term of this patent is extended or adjusted under 35 U.S.C. 154(b) by 46 days.

(21) Appl. No.: 11/636,580

(22) Filed: Dec. 11, 2006

(65) Prior Publication Data
US 2007/0138907 A1 Jun. 21, 2007

(30) Foreign Application Priority Data
Dec. 16, 2005 (JP) ............... 2005-362806

(51) Int. Cl.
*H03H 9/25* (2006.01)
(52) U.S. Cl. .............. 310/313 D; 310/348; 310/365
(58) Field of Classification Search ............. 310/313 D, 310/340, 344, 348, 363–365
See application file for complete search history.

(56) References Cited

U.S. PATENT DOCUMENTS

| | | | | |
|---|---|---|---|---|
| 6,898,831 B2* | 5/2005 | Iwamoto | .............. | 29/25.35 |
| 6,951,047 B2* | 10/2005 | Tomioka et al. | ............. | 29/25.35 |
| 7,112,912 B2* | 9/2006 | Inoue et al. | .............. | 310/313 B |
| 2002/0113525 A1* | 8/2002 | Nakao et al. | ................. | 310/348 |
| 2002/0140322 A1* | 10/2002 | Suga et al. | ................... | 310/348 |
| 2004/0160145 A1* | 8/2004 | Takeuchi et al. | ............ | 310/348 |

FOREIGN PATENT DOCUMENTS

| | | | |
|---|---|---|---|
| JP | A 2002-026656 | | 1/2002 |
| JP | 2004-153412 | * | 5/2004 |

* cited by examiner

*Primary Examiner*—Thomas M Dougherty
(74) *Attorney, Agent, or Firm*—Oliff & Berridge, PLC

(57) ABSTRACT

A surface acoustic wave element includes a piezoelectric substrate, an IDT composed of a pair of first and second comb-like electrodes, formed around a center of the piezoelectric substrate, and formed on a surface of the surface acoustic wave element, and a pair of first and second terminals electrically connected to the IDT, formed at central and peripheral areas of the piezoelectric substrate, respectively, in which a package is bonded with an adhesive to a surface of the surface acoustic wave element, opposite to the surface formed with the IDT.

5 Claims, 4 Drawing Sheets

SURFACE ACOUSTIC WAVE ELEMENT AND SURFACE ACOUSTIC WAVE DEVICE USING THE SAME

BACKGROUND OF THE INVENTION

1. Technical Field

The present invention relates to a surface acoustic wave element and a surface acoustic wave device using the same.

2. Related Art

A surface acoustic wave device (hereinafter referred to as a "SAW device") is widely used in applications for compact information equipments such as HDDs (Hard Disk Drives), mobile computers, or IC cards, or mobile communication equipments such as cellar telephones, automobile telephones, or paging systems.

FIG. 6 is a schematic perspective view of an existing SAW device 1, in which a piezoelectric element 4 is contained in a package.

An IDT (Inter Digital Transducer) composed of a pair of comb-like electrodes 5a, 5b is formed around a center of the piezoelectric element 4, and reflectors 6, 6 are formed at opposite sides of the IDT 5, respectively.

The piezoelectric element 4 is bonded to an inner bottom of the package 2 using an adhesive 3 in a manner to bond a central area of the piezoelectric element 4 to the package 2 by the adhere in order to prevent the piezoelectric element 4 from swinging significantly enough to clash with the package 2 at the time of, for example, a drop of an electronic device such as a cellar phone or the like equipped with the SAW device.

The piezoelectric element 4 has a pair of terminals 7, 7 electrically connected to the comb-like electrodes 5a, 5a, respectively, in which the terminals 7, 7 are connected to electrodes at a side of the package 2 or to a semiconductor element 8 by wire bonding. Herein, the pair of terminals 7, 7 are disposed on the adhesive 3, i.e., at the central area of the piezoelectric element 4 since the adhere 3 is used as a receiver for weight which is applied at the time of the wire bonding to the terminals 7, 7.

In the SAW device 1 having the central area of the aforementioned piezoelectric element 4 bonded to the package 2, however, there is a fear of a change in an oscillation property due to warpage in the area formed with the IDT 5, which is resulted from contraction stress of the adhesive 3 or the like.

FIG. 7 is a schematic perspective view of a SAW device 9 which has been contemplated to reduce influence on an oscillation property, which is given by the contraction stress of the adhesive 3 as described above.

In other words, in the case where the SAW device 9 is contained in the electric device which is hardly moved, the piezoelectric element 4 is less likely to clash with the package 3, so that peripheral area other than the area formed with the IDT 5 is to be bonded to the package 2 by the adhesive 3. As described above, the terminals 7, 7 are disposed at the same peripheral area where the adhesive 3 is disposed since the adhesive 3 is used as a receiver for a weight at the time of the wire bonding (see, e.g., JP-A-2002-26656).

JA-A-2002-26656 is an example of related art.

In consideration of both cases where the SAW device is used in applications for mobile electronic devices such as a cellar telephone and used in applications for hardly mobile electronic devices, it is necessary to prepare two types of SAW devices 1, 9 different in positions of the terminals 7, 7, resulting in relatively expensive design development costs as well as causing increase in a stock amount.

SUMMARY

An advantage of the invention is to provide a surface acoustic wave element and surface acoustic wave device at a low price, having a good oscillation property, which can be used in applications for various electronic devices.

According to a first aspect of the invention, a surface acoustic wave element includes a piezoelectric substrate, an IDT composed of a pair of first and second comb-like electrodes, formed around a center of the piezoelectric substrate, and formed on a surface of the surface acoustic wave element, and a pair of first and second terminals electrically connected to the IDT, formed at central and peripheral areas of the piezoelectric substrate, respectively, in which a package is bonded with an adhesive to a surface of the surface acoustic wave element, opposite to the surface formed with the IDT.

According to this aspect of the invention, the pair of first and second terminals is formed at the central and peripheral areas of the piezoelectric substrate respectively. Therefore, in the case of using this surface acoustic wave element in applications for a mobile electric device, the central area is coated with the adhesive to reduce a swing of the element in association with moving while the pair of terminals formed at this central area is wire-boded. In the case of use in applications for a hardly mobile electric device, the peripheral area is coated with the adhesive to reduce an influence on an oscillation property in association with a contraction stress of the adhesive while the pair of terminals formed at the peripheral area is wire-bonded. Therefore, this one type of SAW element can deal with both the mobile and immobile electronic devices.

Thus, a surface acoustic wave element at a low price, having a good oscillation property can be provided, which can be used in applications for various electronic devices.

In the above-mentioned structure, it is preferable that the pair of terminals be disposed at one side of the piezoelectric substrate in a latitudinal direction.

In this manner, since the pair of terminals is disposed at one side of the piezoelectric substrate in a latitudinal direction, in the case of the surface acoustic wave element connected to the semiconductor element through a bonding wire, the bonding wire can be shortened by disposing the aforementioned side where the pair of terminal is formed, at a side where the semiconductor element is disposed.

In the above-mentioned structure, it is preferable that the pair of terminals be formed by extending conductive patterns electrically connected to the first and second comb-like electrodes, respectively, through the use of reflectors disposed at opposite sides of the IDT in a direction that electrode fingers of the comb-like electrodes are arranged.

In this manner, the pair of terminals is formed by extending the conductive patterns electrically connected to the first and second comb-like electrodes, respectively, through the use of the reflectors disposed at the opposite sides of the IDT in a direction that electrode fingers of the comb-like electrodes are arranged. Therefore, a good oscillation property can be resulted from elimination of a necessity for extending the conductive pattern at the area where the reflectors are disposed, i.e., in a direction that the electrode fingers of the comb-like electrode, i.e., a direction of propagation of the surface acoustic wave, which is likely to have an influence on an oscillation property.

In the above-mentioned structure, it is preferable that the first terminal be formed such that the first comb-like electrode of the pairs is extended to a region facing to a bus bar of the first comb-like electrode, and that the second terminal be formed such that the second comb-like electrode of the pair is extended to a region facing to a bus bar of the second comb-like electrode.

In this manner, the first terminal is formed such that the first comb-like electrode of the pairs is extended to a region facing to a bus bar of the first comb-like electrode, and the second terminal is formed such that the second comb-like electrode of the pair is extended to a region facing to a bus bar of the second comb-like electrode.

According to a second aspect of the invention, a surface acoustic wave device includes a surface acoustic wave element having a piezoelectric substrate, an IDT composed of a pair of comb-like electrodes, formed around a center of a surface of the piezoelectric substrate, and formed on a surface of the surface acoustic wave element, and a pair of first and second terminals electrically connected to the IDT, formed at central and peripheral areas of the piezoelectric substrate, respectively. The surface acoustic wave device also includes a package bonded and secured with an adhesive to a surface of the surface acoustic wave element, opposite to the surface formed with the IDT.

In this structure, the pair of first and second terminals electrically connected to the IDT is formed at the central and peripheral areas of the piezoelectric substrate, respectively, so that one type of the surface acoustic wave element can deal with both mobile and non-mobile electronic devices in a manner similar to the first aspect of the invention, thereby resulting in reduction in development costs or in a stock amount.

Therefore, the surface acoustic wave device at a low price, having a good oscillation property can be provided, which be used in applications for various electronic devices.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
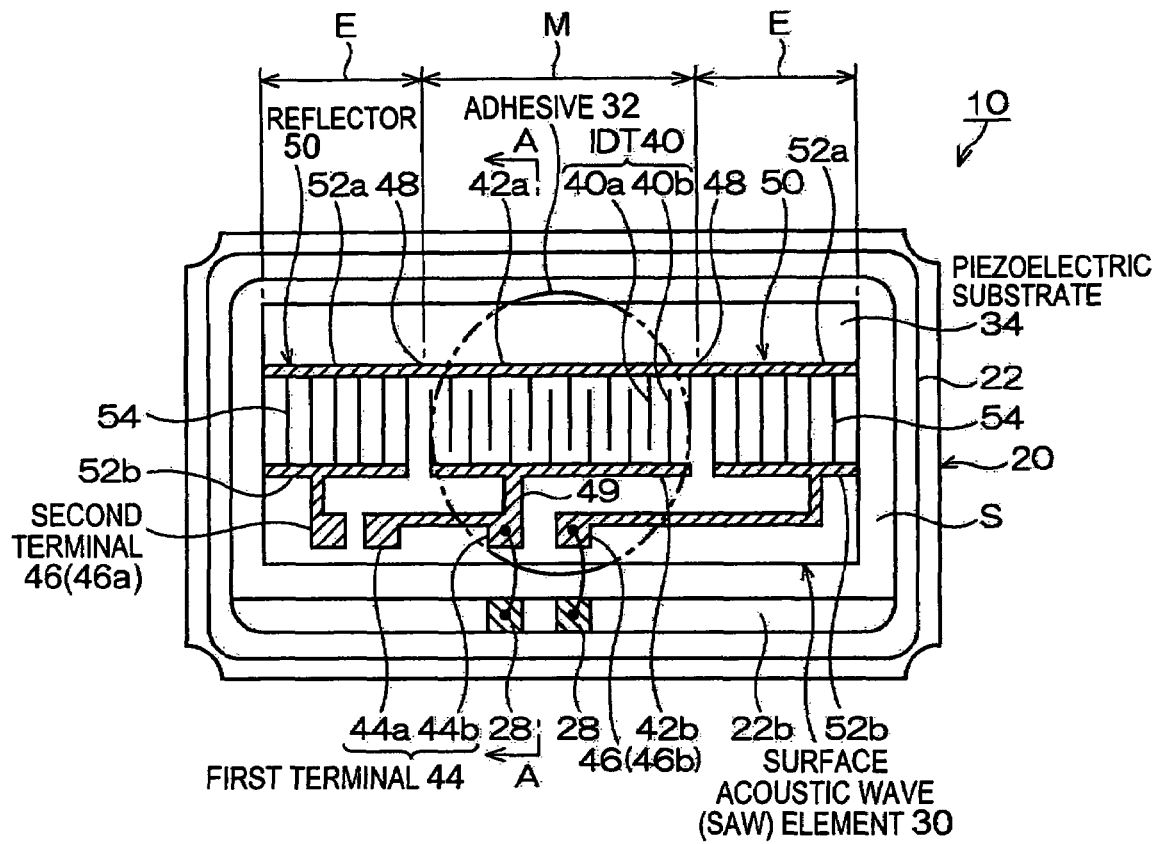
FIG. 1 is a schematic perspective view of a surface acoustic wave device according to an embodiment of the invention.
Figure 2:
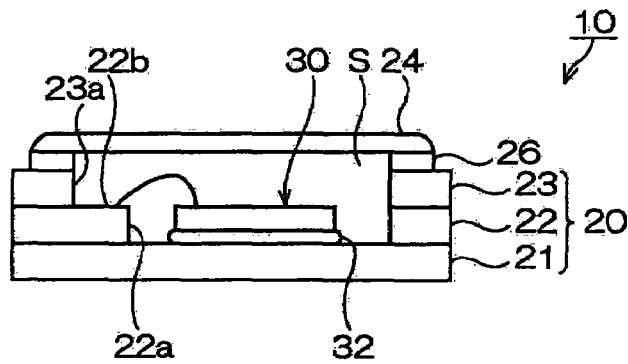
FIG. 2 is a schematic cross section view of FIG. 1 along the line A-A.

FIGS. 1 and 2 show a surface acoustic wave device (hereinafter referred to as a "SAW device") 10 according to an embodiment of the invention, in which FIG. 1 shows a schematic plain view of the surface acoustic wave device and FIG. 2 shows a schematic cross section view of FIG. 1 along the line A-A. Meanwhile, FIG. 1 shows a view that is seen through a casing for convenience of understanding. Parallel oblique lines in FIG. 1 do not express a cross section.

In those FIGS., the SAW device 10 contains an electronic surface wave element (hereinafter referred to as a "SAW element") 30 in a package 20.

As shown in FIG. 2, the package 20 is wholly formed in a substantially rectangular shape by a sintering after lamination of first, second, and third substrates 21, 22, 23 as an insulating material, which are formed by shaping a ceramic green sheet of oxidized aluminum.

The second and third substrates 22, 23 each have predetermined via holes 22a, 23a inside such that an internal space S is formed in the case of lamination of the second and third substrates 22, 23 onto the first substrate 21.

The internal space S is a space for containing the SAW element 30 therein, which is hermetically sealed by bonding a lid 24 to an end face at a side of an opening after mounting of the SAW element 30, as shown in FIG. 2.

Used as the lid 24 in this embodiment is a conductor metal such as Fe—Ni—Co alloy of metal system, and the lid 24 is bonded to the package 20 by a seal ring 26. The lid 24 is electrically connected to a ground terminal, not shown, through a conductive part, not shown, inside the package 20, thereby being connected to ground.

Furthermore, the via hole 22a of the second substrate 22 is formed smaller than the via hole 23a of the third substrate 23 such that an upper surface of the second substrate 22 is partially exposed to the internal space S to form an upward tier section 22b in the case of lamination of the third substrate 23 onto the second substrate 22.

The upward tier section 22b exposed to the internal space S is disposed with electrode sections 28, 28 which are formed by metallizing, for example, tungsten (W) as a base and by thereafter plating the metallized tungsten with nickel (Ni) and gold, as shown in FIG. 1. The electrode sections 28, 28 are electrodes electrically connected to the SAW element 30 through a bonding wire such as a gold wire.

The first substrate 21 is a substrate composing a bottom of the package 20, as shown in FIG. 2, and is bonded to the SAW element 30 by the adhesive 32. In other words, an upper surface of the first substrate 21 of the package 20, which is exposed to the internal space S, is coated with the nonconductive or conductive adhesive 32, and the SAW element 30 is placed on the adhesive 32, with the surface opposite to the surface formed with an IDT 40 to be described later contacting the adhesive 32, and then the SAW element 30 is put in a heating furnace to heat and harden the adhesive 32. In this manner, the SAW element 30 is bonded and secured to the package 20.

In this embodiment, as shown in FIG. 1, the adhesive 32 coats a central area M but may coat a peripheral area E as well. This point will be described later in detail.

The SAW element 30 has the IDT (Inter Digital Transducer) 40 and reflectors 50, 50 on a main surface of a piezoelectric substrate 34, as shown in FIG. 1.

With respect to the piezoelectric substrate 34, used as a piezoelectric material is, for example, a single-crystal substrate such as crystal or the like, or a multilayer substrate such as a substrate that a ZnO film formed on an Si substrate. In this embodiment, a crystal wafer cut in a rectangular shape is used as the piezoelectric material.

The IDT 40 is formed around a center of the piezoelectric substrate 34 and is composed of a pair of comb-like electrodes 40a, 40b. The comb-like electrodes 40a, 40b each are disposed in a striped shape in a longitudinal direction of the piezoelectric substrate 34 along bus bars 42a, 42 formed in parallel with each other, such that a plurality of electrode fingers of the bomb-like electrodes 40a, 40b are disposed at predetermined intervals in a manner to thrust into each other in a staggered configuration.

This IDT 40 is formed on a surface of the piezoelectric substrate 34 by a photolithography method after formation of conductive metal such as aluminum, titanium, or the like in a thin film form by means of, e.g., a vapor deposition or sputtering method.

Furthermore, two reflectors 50, 50 are formed at opposite sides of this IDT 40, that is, both sides in a direction that the electrode fingers of the comb-like electrodes 40a, 40b are arranged, i.e., in a longitudinal direction of the piezoelectric substrate 34 in FIG. 1. The reflectors 50, 50 have a function of reflecting a surface acoustic wave propagated from the IDT 40 to seal energy of the surface acoustic wave inside, and a plurality of conductive sections 54, 56 . . . parallel to the electrode fingers of the IDT 40 connect two parallel bus bars 52a, 52b to each other.

Meanwhile, in a manner similar to the IDT 40, this reflector 50 is also formed from a conductive metal such as aluminum, titanium, or the like.

A pair of terminals 44, 46 with opposite polarities, which are electrically connected to the electrode sections 28, 28 at a side of the package 20 through bonding wires such as a gold wire, is formed at a surface of the piezoelectric substrate 34. The pair of terminals 44, 46 is electrically connected to the IDT 40 to allow input and output of signals therebetween.

The terminals 44, 46, i.e., the first terminal 44 and the second terminal 46, which are in pairs and electrically connected to the IDT 40, are formed at the central area M and the peripheral area E of the piezoelectric substrate 34, respectively. Herein, the central area M is defined as an area disposed with the IDT 40 while the peripheral area E is defined as an area other than the area disposed with the IDT 40.

In other words, the first terminal 44 is such that a conductive pattern 49, which is electrically connected to one of the comb-like electrodes 40a, 40b in pairs, i.e., the first comb-like electrode 40b, is extended to each of the central area M and the peripheral area E, in which a pad section 44b is formed at the central area M and a pad section 44a is formed at the peripheral section E. Furthermore, the second terminal 46 is such that a conductive pattern 48, which is electrically connected the other comb-like electrode, i.e., the second comb-like electrode 40a, is extended to each of the central area M and the peripheral area E, in which a pad section 46b is formed at the central area M and a pad section 46a is formed at the peripheral section E.

Thus, as shown in FIG. 1, the central area M, which is disposed with the pad section 44b of the first terminal 44 and the pad section 46b of the second terminal 46, is coated with the adhesive 32, and the wire bonding can be made to the pad sections 44b, 46b upon application of ultrasound with the adhesive 32 as a receiver.

In the SAW element 30, even where the peripheral area E is coated with the adhesive 32, since the pad section 44a of the first terminal 44 and the pad section 46a of the second terminal 46 are disposed at the peripheral section E, the wire bonding can be made to the pad sections 44a, 46a.

Furthermore, the pair of terminals 44, 46 is disposed at one side of the piezoelectric substrate 34 in a latitudinal direction. In other words, in this embodiment, the second terminal 46 is formed by extending the conductive patterns 48, 48 connected to the second comb-like electrode 40a of the pair, to a periphery of one side disposed with the first comb-like electrode 40b.

Thus, the electrode sections 28, 28 at a side of the package 20, which are electrically connected to the SAW element 30, are not disposed at opposite sides of the piezoelectric substrate 34 in a latitudinal direction but gathered at one side where the pair of terminals 44, 46 are formed, thereby being able to aim downsizing of a package.

In the case where the pair of terminals 44, 46, which are electrically connected to the comb-like electrodes 40a, 40b each located at opposite sides of the piezoelectric substrate 34 in a latitudinal direction are gathered at one side, the extended pattern is more likely to have an influence on an oscillation property since the conductive pattern 48 to be extended to one side undesirably passes in a direction that the electrode fingers of the comb-like electrodes 40a, 40b are arranged, i.e., in the longitudinal direction in FIG. 1. Therefore, in this embodiment, the pair of terminals 44, 46 are formed by extending the conductive patterns 48, 49, which are electrically connected to the comb-like electrodes 40a, 40b, through the use of the reflectors 50, 50 disposed adjacently to opposites sides of the IDT 40, i.e., opposite sides of the piezoelectric substrate 34 in the longitudinal direction.

In other words, in FIG. 1, the second terminal 46 is formed by extending the conductive patterns 48, 48 connected to the second comb-like electrode 40a of the pairs, through the reflectors 50, 50 at opposite sides of the IDT 40, respectively, in a manner to locate adjacently to the opposite sides of the first terminal 44, i.e., the terminals 44a, 44b. To be more precise, the second terminals 46a, 46b are made adjacent to the opposite sides of the first terminal 44 through the reflectors 50, 50, respectively, by connecting the bus bar 42a of the comb-like electrode 40a through the conductive patterns 48, 48 to the bus bars 52a, 52a of the reflectors 50, 50 as an extension of the bus bar 42 through the conductive patterns 48, 48. Therefore, the conductive patterns 48, 48, which connect the comb-like electrode 40a to the second terminal 46, do not pass in a direction that the electrode fingers of the comb-like electrodes 40a, 40b are arranged, resulting in a good oscillation property.

An embodiment of the invention has a structure as described above, in which the first and second terminals 44, 46, which are in pairs and electrically connected to the IDT 40, are formed at the central area M and the peripheral area E of the piezoelectric substrate 34, respectively. Therefore, in the case of using this SAW device 10 in applications for a mobile electric device, the central area M is coated with the adhesive 32 to reduce a swing of the SAW element 30 in association with moving while the wire bonding can be made to the pair of terminals 44b, 46b formed at this central area M. In the case of use in applications for a hardly mobile electric device, the peripheral area E is coated with the adhesive 32 to reduce an influence in an oscillation property in association with a contraction stress of the adhesive 32 while the wire bonding can be made to the pair of terminals 44a, 46a formed at the peripheral area E. Therefore, this one type of SAW element 30 can deal with both the mobile and immobile electronic devices.

Meanwhile, the SAW device 10 may be transformed to a SAW oscillator by equipping an interior of the package 20 with an oscillation circuit element such as a semiconductor element having a circuit structure for oscillating the SAW element 30 at least. In this case, the bonding wire for connecting the SAW element 30 to the oscillation circuit element can be shortened by disposing the side of the saw element 30 where the pair of terminals 44, 46 is formed, at a side where the oscillation circuit element is disposed.

Furthermore, in an embodiment such that the pair of terminals 44, 46 is disposed at only one side of the piezoelectric element 34 in a latitudinal direction in a manner similar to this embodiment, the pair of terminals 44, 46 are formed at one of two peripheral areas E, E that sandwich the central area M therebetween, for example, the pair of terminals 44, 46 are formed at the peripheral area E at the left side of FIG. 1 in this embodiment, but may be formed at the peripheral area E at the right side of FIG. 1.

Figure 3:
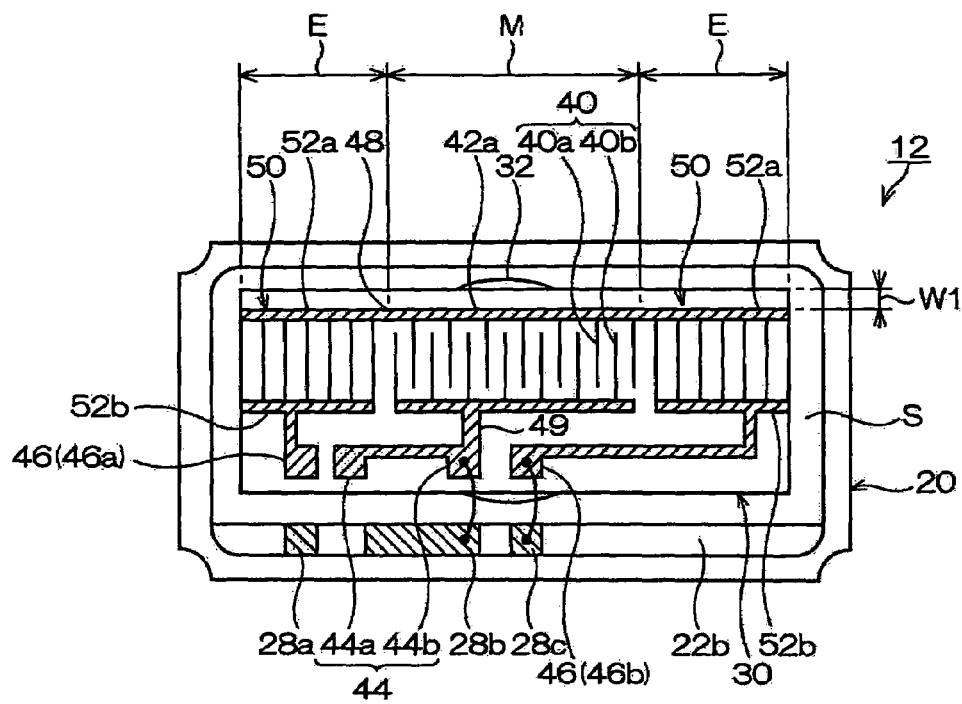
FIG. 3 is a schematic plain view of a first modification example of the surface acoustic wave device according to the embodiment of the invention.

FIG. 3 is a schematic plain view of a SAW device 12 as a first modification example according to the aforementioned embodiment of the invention. Since elements assigned with the same numerals as those used in the embodiment in accordance with FIGS. 1 and 2 have common structures, duplicated explanations are omitted and explanation hereinafter will be based on dissimilarities only.

The SAW device 12 in FIG. 3 is different from the SAW device 10 in FIGS. 1 and 2 only in a width of the SAW element 30 and the electrode section 28 at a side of the package 20.

In other words, in the SAW device 12, the pair of terminals 44, 46 are disposed at only one side of the piezoelectric substrate 33 in a latitudinal direction in a manner similar to the SAW device 10, thereby narrowing a width W1 in a latitudinal direction at a side of the second comb-like electrode 40a where neither the pair of terminals 44, 46, the IDT 40, nor the reflectors 50, 50 are formed.

Furthermore, with respect to the electrode section 28 at a side of the package 20, in this first modification example, electrode sections 28a, 28b, 28c, which are corresponding to the first and second terminals 44, 46 each disposed at the central area M and the peripheral area E, are previously formed to the package 20. In other words, out of three electrode sections, the center electrode section 28b, which is corresponding to the first terminal 44, is formed at the upward tier section 22b adjacently to the first terminal 44 in a manner to correspond to a distance between the pad section 44b of the first terminal 44 located at the central area M and the pad section 44a located at the peripheral area E. The electric sections 28a, 28c at opposite sides of the center electrode section 28b, which are corresponding to the second terminal 46, are formed at the upward tier section 22b such that the electrode section 28a is adjacent to the pad section 46a located at the peripheral area E while the electric section 28c is adjacent to the pad section 46b located at the central area M.

The first modification example according to the embodiment of the invention has the structure as described above, in which the width W1 at a side of the second comb-like electrode 40a where the pair of terminals 44, 46 are not formed is made narrow, thereby being able to aim downsizing of the SAW element 30.

Furthermore, in the SAW device 12 according to this modification example, the plurality of electrode sections 28a, 28b, 28c, which are corresponding to the pair of terminals 44, 46 each disposed at the central area M and the peripheral area E, are previously formed at the package 20. Therefore, the package 20, in which the bonding wire can be shortened by making the electrode sections 28a, 28b, 28c adjacent to the corresponding pair of terminals 44, 46, can be formed in a manner to deal with both the mobile and immobile electronic devices.

Figure 4:
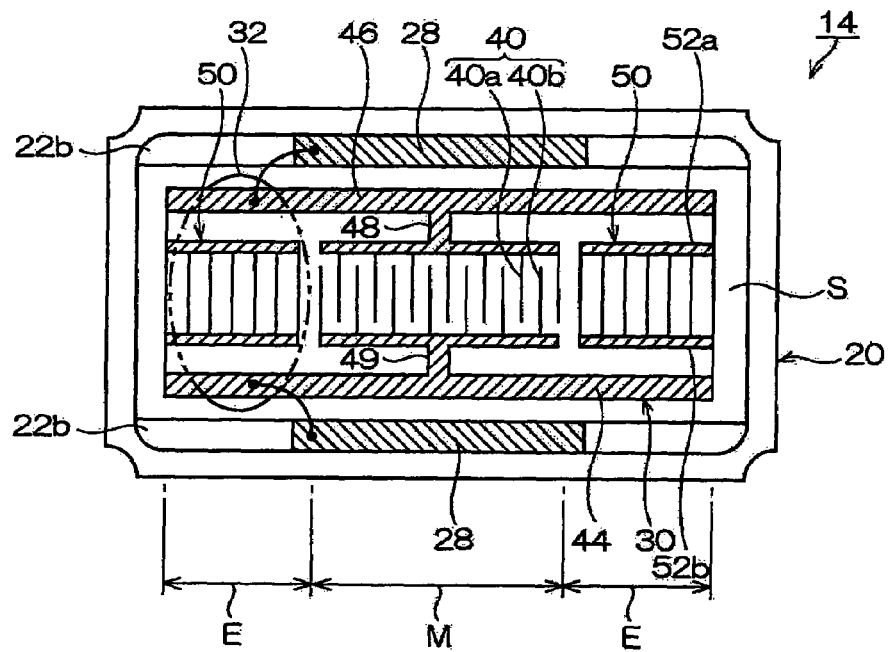
FIG. 4 is a schematic plain view of a second modification example of the surface acoustic wave device according to the embodiment of the invention.

FIG. 4 is a schematic plain view of a SAW device 14 as a second modification example according to the embodiment of the invention. Since elements assigned with the same numerals as those used in the embodiments in the embodiments in accordance with FIGS. 1 to 3 have common structures, duplicated explanations are omitted and explanation hereinafter will be based on dissimilarities only.

The SAW device 14 in FIG. 4 is different from the SAW devices 10, 12 in FIGS. 1 to 3 mainly in configurations of the pair of terminals 44, 46.

In other words, the first terminal 44 is formed such that the first comb-like electrode 40b of the pairs is extended to a vicinity of the piezoelectric substrate facing to the bus bar of the first comb-like electrode 40b. Furthermore, the second terminal 46 is formed such that the second comb-like electrode 40a of the pairs is extended to a vicinity of the piezoelectric substrate facing to the bus bar of the second comb-like electrode 40a. The first and second terminals 44, 46 are formed at the central area M and the peripheral area E of the piezoelectric substrate 34, respectively.

To be more precise, the first terminal 44 is formed such that the conductive pattern 49, which is electrically connected to the bus bar of the comb-like electrode 40b, is extended without intersecting with a direction that the electrode fingers are arranged, to a periphery of a side of the comb-like electrode 40b, i.e., the downside of FIG. 4, in a latitudinal direction of the piezoelectric element 30. Furthermore, the second terminal 46 is formed such that the conductive pattern 48, which is electrically connected to the bus bar of the comb-like electrode 40a, is extended without intersecting with a direction that the electrode fingers are arranged, to a periphery of a side of the comb-like electrode 40a, i.e., a the upside of FIG. 4, in a latitudinal direction of the piezoelectric element 30. The pair of terminals 44, 46 is formed over the peripheral area E at the left side through the central area M to the peripheral area E at the right side in the longitudinal direction of the piezoelectric element 30, respectively. In the case of this modification example, therefore, the pair of terminals 44, 46 are not gathered at one side of the piezoelectric element 30 in a latitudinal direction but disposed at peripheries at opposite sides of the piezoelectric element 30 in a latitudinal direction, as described above.

Meanwhile, in the second modification example, the upward tier sections 22b, 22b are formed at the opposite sides exposed to the internal space S in a latitudinal direction, respectively, and the electrode section 28 is formed over the peripheral areas E and the central area M in a manner to cover the upward tier sections 22b, 22b at the opposite sides in the latitudinal direction.

The second modification example according to the embodiment of the invention has the structure as described above, thereby being able to form the SAW element 30 which requires a simple structure to deal with both the mobile and immobile electronic devices.

Figure 5:
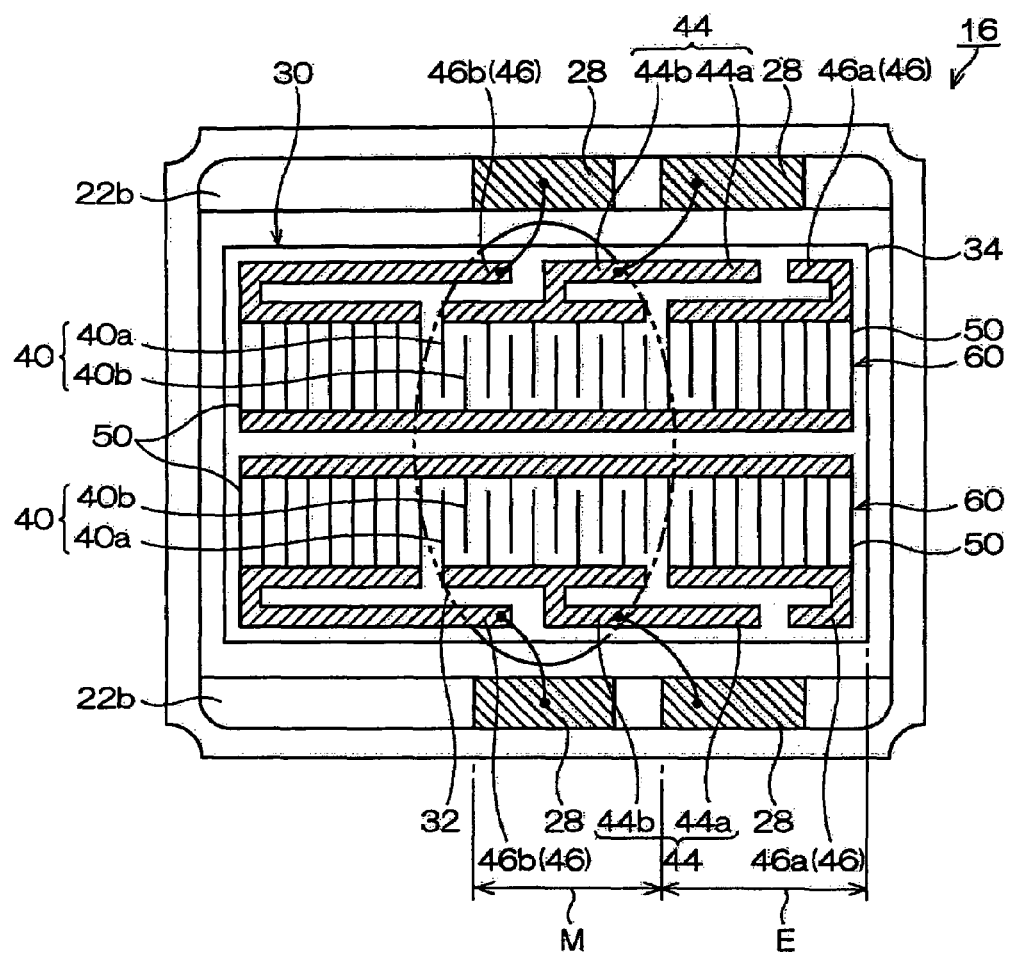
FIG. 5 is a schematic plain view of a third modification example of the surface acoustic wave device according to the embodiment of the invention.
Figure 6:
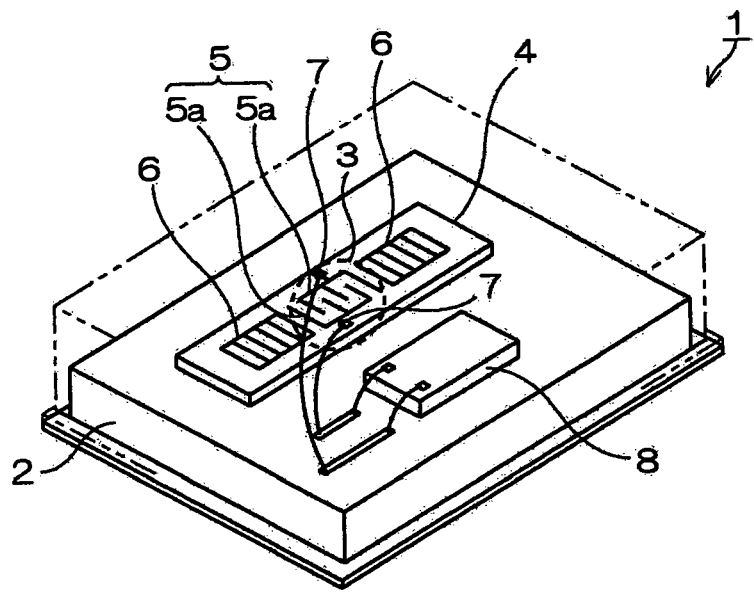
FIG. 6 is a schematic perspective view of an existing SAW device.
Figure 7:
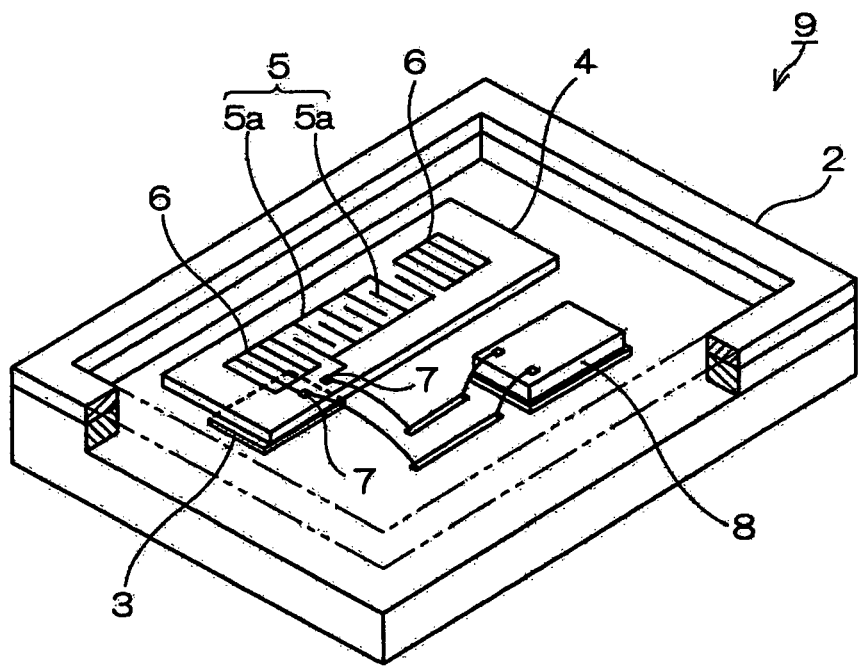
FIG. 7 is a schematic perspective view of an existing SAW device contemplated to reduce influence on an oscillation property due to a contraction stress of an adhesive.

FIG. 5 is a schematic plain view of a SAW device 16 as a third modification example according to the embodiment of the invention. Since elements assigned with the same numerals as those used in the embodiments in the embodiments in accordance with FIGS. 1 to 4 have common structures, duplicated explanations are omitted and explanation hereinafter will be based on dissimilarities only.

The SAW device 16 in FIG. 5 is different from the SAW devices 10, 12, 14 in FIGS. 1 to 4 mainly in a property of a so-called double-mode SAW filer.

In other words, in the SAW device 16, two SAW resonators 60, 60, which each have at least one IDT 40 and the pair of reflectors 50, 50 for reflecting at opposite sides thereof the surface acoustic wave arising from the IDT 40, are disposed at the surface of the piezoelectric substrate 34, in a manner to be adjacent to and in substantially parallel with a direction of propagation of the surface acoustic wave, i.e., a direction that the electrode fingers are arranged. In such the lateral-double-mode SAW filter, the pair of terminals 44, 46 each corresponding to the SAW resonators 60, 60 are also formed at the central area M and the peripheral area E of the piezoelectric substrate 34, respectively, in a manner similar to the embodiments as described above.

Therefore, such the SAW element 30, which enables even the SAW device 16 shown in FIG. 5 to deal with both the mobile and immobile electronic devices, can be formed.

Meanwhile, the lateral-double-mode SAW filter is illustrated in this modification example but the aforementioned embodiment, of course, can be applied for a longitudinal-double-mode SAW filter in which two IDTs 40, 40 are disposed in a direction of propagation of the surface acoustic wave, i.e., a direction that the electrode fingers are arranged.

The invention is not limited to the aforementioned embodiments. Each of structures of the embodiments and modification examples can be arbitrarily combined with each other, omitted, or combined with other structures not shown.

The entire disclosure of Japanese Patent Application No. 2005-362806, filed Dec. 16, 2005 is expressly incorporated by reference herein.

What is claimed is:

1. A surface acoustic wave element comprising:
   a piezoelectric substrate;
   an Inter Digital Transducer (IDT) composed of a pair of first and second comb-like electrodes, formed around a center of the piezoelectric substrate; and
   two pairs of first and second terminals electrically connected to the IDT,
   a surface of the surface acoustic wave element, opposite to the surface formed with the IDT, being bonded to a package with an adhesive,
   at least one of the two pairs of terminals being disposed in a nonoverlapping position with the adhesive.

2. The surface acoustic wave element according to claim 1, the two pairs of terminals being disposed at one side of the piezoelectric substrate in a latitudinal direction.

3. The surface acoustic wave element according to claim 1, the two pairs of terminals being formed by extending conductive patterns electrically connected to the first and second comb-like electrodes, respectively, through the use of reflectors disposed at opposite sides of the IDT in a direction that electrode fingers of the comb-like electrodes are arranged.

4. A surface acoustic wave element comprising:
   a piezoelectric substrate;
   an Inter Digital Transducer (IDT) composed of a pair of first and second comb-like electrodes, formed around a center of the piezoelectric substrate; and
   a pair of first and second terminals electrically connected to the IDT,
   a surface of the surface acoustic wave element, opposite to the surface formed with the TDT, being bonded to a package with an adhesive,
   the first terminal being formed such that the first comb-like electrode of the pairs extends to a region facing a bus bar of the first comb-like electrode, and the second terminal being formed such that the second comb-like electrode of the pair extends to a region facing a bus bar of the second comb-like electrode.

5. A surface acoustic wave device comprising:
   a surface acoustic wave element including:
      a piezoelectric substrate;
      an Inter Digital Transducer (IDT) composed of a pair of comb-like electrodes, formed around a center of a surface of the piezoelectric substrate; and
      two pairs of first and second terminals electrically connected to the IDT, and
   a package bonded and secured with an adhesive to a surface of the surface acoustic wave element, opposite to the surface formed with the IDT,
   at least part of the first terminal overlapping the adhesive, the second terminal being disposed in a nonoverlapping position with the adhesive.

* * * * *